United States Patent [19]
Mehrotra et al.

[11] Patent Number: 4,913,936
[45] Date of Patent: Apr. 3, 1990

[54] METHOD OF SURFACE ALLOYING SIALON ARTICLES

[75] Inventors: Pankaj K. Mehrotra, Greensburg; Joyce L. Swiokla, Ligonier, both of Pa.

[73] Assignee: Kennametal Inc., Latrobe, Pa.

[21] Appl. No.: 331,474

[22] Filed: Mar. 30, 1989

Related U.S. Application Data

[62] Division of Ser. No. 51,964, May 19, 1987, abandoned.

[51] Int. Cl.$^4$ .................. C23C 16/32; C23C 16/40
[52] U.S. Cl. .................. 427/249; 427/255;
427/255.2; 427/255.3; 427/255.7; 427/376.2;
427/419.2; 427/419.7
[58] Field of Search .............. 427/255, 249, 255.1,
427/255.3, 255.7, 376.2, 419.2, 419.7, 248.1

[56] References Cited

U.S. PATENT DOCUMENTS

| | | | |
|---|---|---|---|
| 3,914,473 | 10/1975 | Hale | 427/255 |
| 4,127,416 | 11/1978 | Lumby et al. | 501/97 |
| 4,336,304 | 6/1982 | Landingham et al. | 428/336 |
| 4,424,066 | 1/1984 | Sarin et al. | 51/295 |
| 4,469,489 | 9/1984 | Sarin et al. | 51/295 |
| 4,539,251 | 9/1985 | Sugisawa et al. | 428/216 |
| 4,547,470 | 10/1985 | Tanase et al. | 501/87 |
| 4,563,433 | 1/1986 | Yeckley et al. | 501/97 |
| 4,578,087 | 3/1986 | Tanaka et al. | 51/295 |
| 4,613,549 | 9/1986 | Tanaka et al. | 428/469 |
| 4,629,661 | 12/1986 | Hillert | 428/698 |

FOREIGN PATENT DOCUMENTS

| | | | |
|---|---|---|---|
| 3509572 | 7/1986 | Fed. Rep. of Germany | 427/255 |
| 55-85481 | 6/1980 | Japan | 427/255 |
| 58-145676 | 8/1983 | Japan | 427/255 |

*Primary Examiner*—Sadie Childs
*Attorney, Agent, or Firm*—John J. Prizzi

[57] ABSTRACT

A method of surface alloying a sialon article containing beta-prime-sialon phase ($Si_{6-z}Al_zO_zN_{8-z}$). The method includes the steps of applying an alumina coating to the surface of the sialon article by chemical vapor deposition and then heat treating the coated article at a temperature between about 1300 and 1800 degrees Centigrade for a time sufficient to diffuse some or all of the aluminum and oxygen from the alumina coating into the sialon composition to produce a layer containing beta-prime-sialon phase having an increased Z value compared to the beta-prime-sialon phase in the remainder of the article.

24 Claims, 2 Drawing Sheets

METHOD OF SURFACE ALLOYING SIALON ARTICLES

This is a divisional of application Ser. No. 051,964, filed on May 19, 1987, now abandoned.

BACKGROUND OF THE INVENTION

Materials for cutting tool inserts fall into several well-known categories. These include high speed steels, cast alloys of cobalt and chromium, sintered carbides and ceramic materials. Each type of material has an advantage depending upon the application. Ceramic materials are used in especially difficult applications. They have high hardness, chemical inertness and wear resistance even at elevated temperatures. However, ceramic cutting tools are often deficient in toughness.

There has been a growing interest in the use of ceramic materials known in the art as sialons as materials for cutting tools. Sialons are compositions of silicon, aluminum, oxygen and nitrogen and sometimes other elements. Several sialon phases are recognized including alpha-prime-sialon and beta-prime-sialon. Cutting tools may be made from either alpha-prime-sialons, beta-prime-sialons or mixtures thereof. As with many ceramic compositions, sialons often comprise an intergranular phase. For a description of a beta-prime-sialon material, reference is made to U.S. Pat. No. 4,127,416. For a complete description of mixed alpha-prime-sialon/beta-prime-sialon compositions useful for cutting tool inserts, reference is made to U.S. Pat. Nos. 4,563,433 and 4,547,470.

One advantage of sialon ceramic cutting tool inserts is increased toughness. For a ceramic material, sialons have exceptional toughness. Sialons have higher hot hardness and elevated temperature compressive strength than cemented carbides. This should allow sialons to resist thermal deformation and flank wear during machining better than cemented carbides. A disadvantage of sialon cutting tool inserts is that they have less than desired chemical resistance. Under the conditions of high speed steel roughing, both sialons and cemented carbides will quickly fail by crater wear due to the affinity between these materials and hot steel chips.

It has been suggested that sialon cutting tools be provided with a chemical and abrasion resistant coating applied by chemical vapor deposition. For example, in U.S. Pat. No. 4,539,251, it was taught to provide sialon compositions with a coating of a carbide of Ti, Zr, or Hf, nitride thereof, carbo-nitride thereof, carbo-oxide thereof, and carbo- nitro-oxide thereof. It is further taught in this patent that an alumina coating may be placed over the above described coating, but no suggestion is made to place the alumina coating directly upon the sialon.

Applicants have attempted to place an alumina coating directly upon sialon compositions by chemical vapor deposition in order to significantly retard the chemical reaction with the hot steel chips. However, two problems were discovered that made the use of an alumina coating applied by chemical vapor deposition impractical. Devitrification of the intergranular glass phase occurred producing a B-phase ($Y_2SiAlO_5N$) which results in a substantially lower toughness of the substrate. Also, the intergranular phase near the surface escaped, leaving porosity behind in about a ten micron thick surface layer adjacent to the coatings. The degradation in the substrate properties resulted in a tendency for edge chipping and fracture during metal cutting, although flank wear and crater wear resistances were better than coated cemented carbide tool inserts tested under the same conditions.

The problem of degradation during chemical vapor deposition is related at least in part to the temperature of the substrate during the process. The applicants have determined that simply heating sialon ceramic materials (either the beta-prime-sialon type or the alpha-prime-sialon/beta-prime-sialon type) to 1000 degrees Centigrade for the period of time it normally takes to deposit an alumina coating results in a drop in fracture toughness.

In seeking ways to restore the toughness of alumina coated sialon cutting inserts, applicants have discovered a surface alloyed sialon material that has the toughness of virgin sialon and substantially improved chemical and wear resistance.

SUMMARY OF THE INVENTION

It is an advantage of this invention to provide a method of surface alloying a sialon composition to provide a sialon layer at the surface with an increased aluminum and oxygen content.

It is a further advantage of the herein described invention to provide a sialon ceramic cutting tool insert that has excellent fracture toughness and improved chemical inertness.

Briefly, according to this invention, there is provided a method of alloying the surface of sialon materials to increase the Z value of the beta-prime-sialons near the surface comprising the steps of (a) preparing a sialon core composition; (b) applying a coating of alumina to the surface of the core composition in a thickness of about 1 to 10 microns by chemical vapor deposition; and (c) heat treating the coated composition in a non-oxidizing atmosphere at temperatures and pressures and for times until at least a portion of the alumina coating diffuses into the surface of the core composition. Preferably, at least one-half of the volume of the alumina coating diffuses into the surface of the core composition. The sialon core composition consists essentially of alpha-prime-sialon and/or beta-prime-sialon, and permissively, an intergranular phase and, optionally, substantially inert refractory phases. The refractory phases are selected from the group consisting of refractory oxides, carbides, and nitrides of metals, and mixtures, compounds and solid solutions thereof. Preferably, the chemical vapor deposition of the alumina coating is made at temperatures between 800 and 1100 degrees Centigrade, and most preferably, the chemical vapor deposition of the alumina coating is made at temperatures between 950 and 1050 degrees Centigrade. The thickness of the alumina coating applied by chemical vapor deposition is between 1 and 10 microns, preferably 5 to 7 microns.

The heat treating conditions suitable for preparing materials according to this invention are set forth in the following table:

| Condition | Useful Range | Preferred Range |
|---|---|---|
| Temperature | 1300–1800° C. | 1500–1700° C. |
| Pressure | up to 30 ksi | up to 30 ksi |
| Time | 15 min. to 5 hours | about 1 hour |
| Atmosphere | $N_2$, Ar, He | $N_2$ |

Where pressure is applied, it is preferably applied by hot isostatic pressing. The times and temperatures are, of course, related to each other and furnace load. The higher the temperature, the shorter the time required. The larger the furnace load, the longer the time. The precise heat treating conditions are those that will permit the aluminum and oxygen in the alumina coating to diffuse into the sialon surface and to recover the loss of toughness that takes place during the chemical vapor deposition process. In one embodiment, the times and temperatures are selected to cause only a portion of the aluminum and oxygen to diffuse into the sialon workpiece leaving a portion of the alumina on the surface as alpha alumina. With heat treating at lower temperatures and shorter times, it is more likely alumina will be left upon the surface after heat treatment. With even lower temperatures and/or even shorter times, the thickness of the alumina coating will increase.

According to one specific embodiment, the core composition consists essentially of a matrix of beta-prime-sialon 0.1 to 10 volume percent intergranular phase. According to yet another specific embodiment, the core composition consists essentially of a matrix of up to 70 volume percent alpha-prime-sialon, 10 to 99.9 volume percent beta-prime-sialon and up to 10 percent of an intergranular phase. A variation of these embodiments would be similar compositions having a substantially inert refractory phase distributed in the matrix. According to still yet another specific embodiment, the sialons in the core composition have a volume ratio of alpha-prime-sialon to beta-prime-sialon between 5:95 and 95:5.

Generally, the intergranular phase will comprise a glassy or crystalline phase from the group YAG, N-YAM, Y-N-alpha-wollastonite, B-phase, N-apatite, N-melilite and glass.

The substantially inert refractory phases may comprise phases such as titanium nitride which are dispersed within the sialon matrix of the core composition. During manufacture of the core, they are mixed with the sialon forming ingredients as a fine powder. The substantially inert refractory phase may be present in amounts up to 80 volume percent. The refractory phases are called substantially inert because there is little reaction between them and the sialon matrix phase.

In addition to the method, there is provided according to this invention, a new sialon ceramic material useful, for example, for cutting tools, comprising a ceramic core consisting essentially of alpha-prime-sialon and/or beta-prime-sialon, and, permissively an intergranular phase and, optionally, substantially inert refractory phases, said sialon ceramic material having an alloyed surface layer having a substantially increased aluminum and oxygen content as compared with the core composition. The beta-prime-sialon phase in the core comprises a lower Z sialon than the beta-prime-sialon phase in the alloyed surface layer. Preferably, the alloyed surface layer is approximately 2 to 10 microns thick. Most preferably, the porosity of the surface layer is equal to the porosity of the core. It is especially preferred that a small amount of alumina remain upon the surface of the material or cutting tools.

In a specific preferred embodiment, the beta-prime-sialon phase of the core material has a Z value greater than 0 and less than or equal to 2 and the beta-prime-sialon phase of the alloyed surface layer has a Z value greater than that of the core material and less than or equal to 4. The Z value of a beta-prime-sialon is defined by the following formula: $Si_{6-z}Al_zO_zN_{8-z}$.

According to a special method embodiment of this invention, a method is provided for alloying the surface of the sialon workpieces to increase the aluminum and oxygen content and for providing an outer coating over the alloyed surface comprising a refractory coating composition being carbides, nitrides, carbo-nitrides, oxides or mixtures thereof of vanadium, titanium, tantalum, niobium, hafnium or zirconium. This method comprises first applying an alumina coating to the surface of the sialon core composition by chemical vapor deposition and then applying the refractory coating composition by chemical vapor deposition over the alumina coating. The heat treatment step is controlled so that at least a substantial portion of the aluminum and oxygen of the alumina coating diffuses into the core composition but heat treatment is discontinued while at least a portion of the outer refractory coating retains its chemical integrity. Specifically, if the outer refractory coating is titanium nitride, then the heat treatment is preferably discontinued while a small layer of alumina may be found between the alloyed surface of the core composition and the titanium nitride coating. This special method embodiment results in a new sialon ceramic material comprising a sialon ceramic core having an alloyed layer of higher aluminum and oxygen content and an adjacent refractory surface layer or coating which comprises carbides, nitrides, carbonitrides, oxides or mixtures of vanadium, titanium, tantalum, niobium, hafnium or zirconium.

BRIEF DESCRIPTION OF THE DRAWINGS

Further features and other objects and advantages will become clear from the following description made with reference to the drawings in which.

[1] KYON is a trademark of Kennametal Inc. for ceramic compositions.

Figure 1:
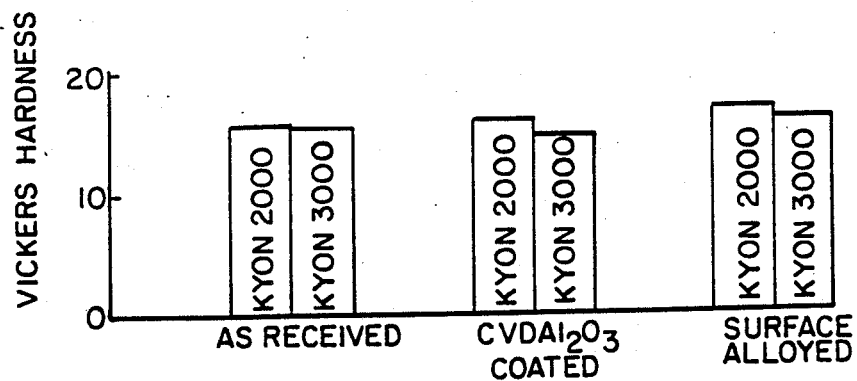
FIG. 1 is a bar graph comparing Vickers hardness (18.5 kg loads) (GPa) of an alpha-prime-sialon/beta-prime-sialon cutting tool composition (KYON 2000)[1] and a beta-prime-sialon cutting tool composition (KYON 3000) as received, after application of an alumina coating by chemical vapor deposition and after surface alloying according to this invention.
Figure 2:
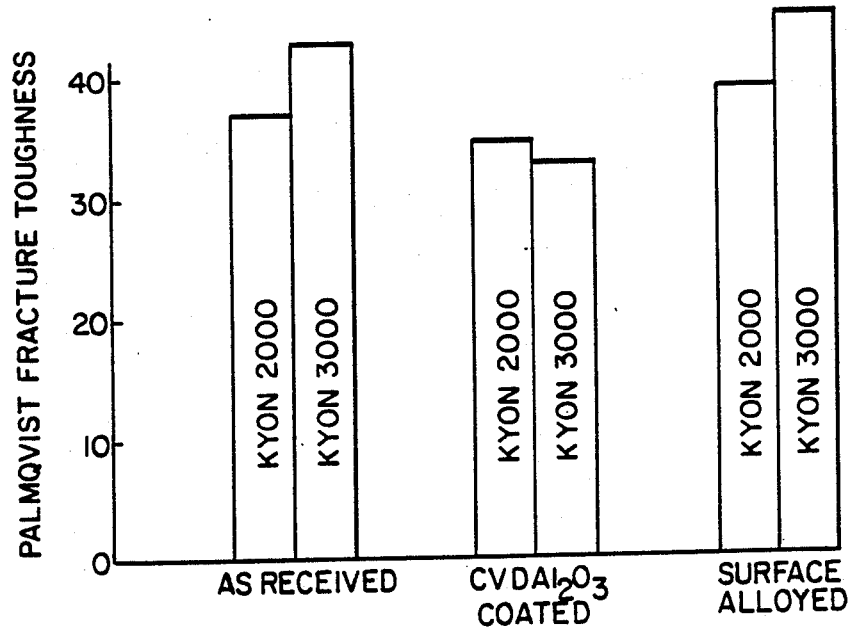

FIG. 2 is a bar graph comparing the Palmqvist fracture toughness, (18.5 kg loads) (kg/mm) of the sialon compositions referred to in FIG. 1 as received, after application of an alumna coating and after surface alloying.

Figure 3:
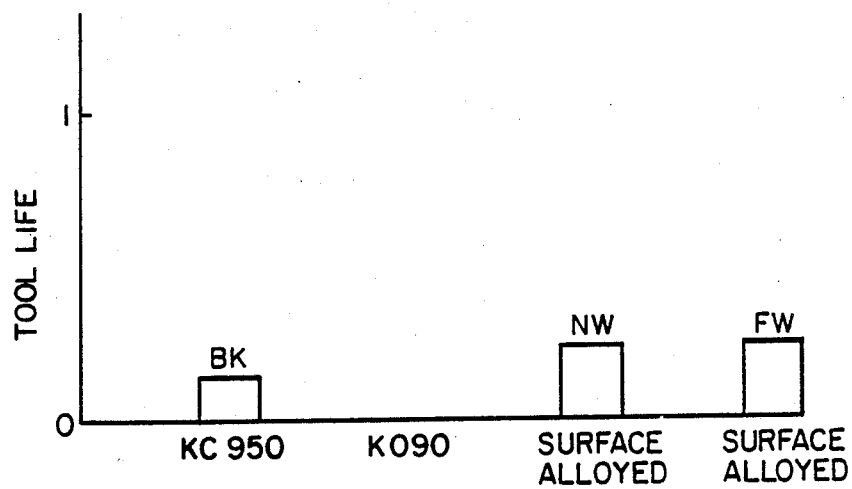

FIG. 3 is a bar graph comparing tool-lives (minutes) and failure modes of a cemented carbide (KC950 Kennametal Grade), a two-phase ceramic composition comprising alumina and titanium carbide (K090 Kennametal Grade) and two surface alloyed sialon compositions according to this invention; specifically, an alpha-prime-sialon/beta-prime-sialon composition (KYON 2000) and a beta-prime-sialon composition (KYON 3000) in high speed roughing of low alloy steel (4340).

Figure 4:
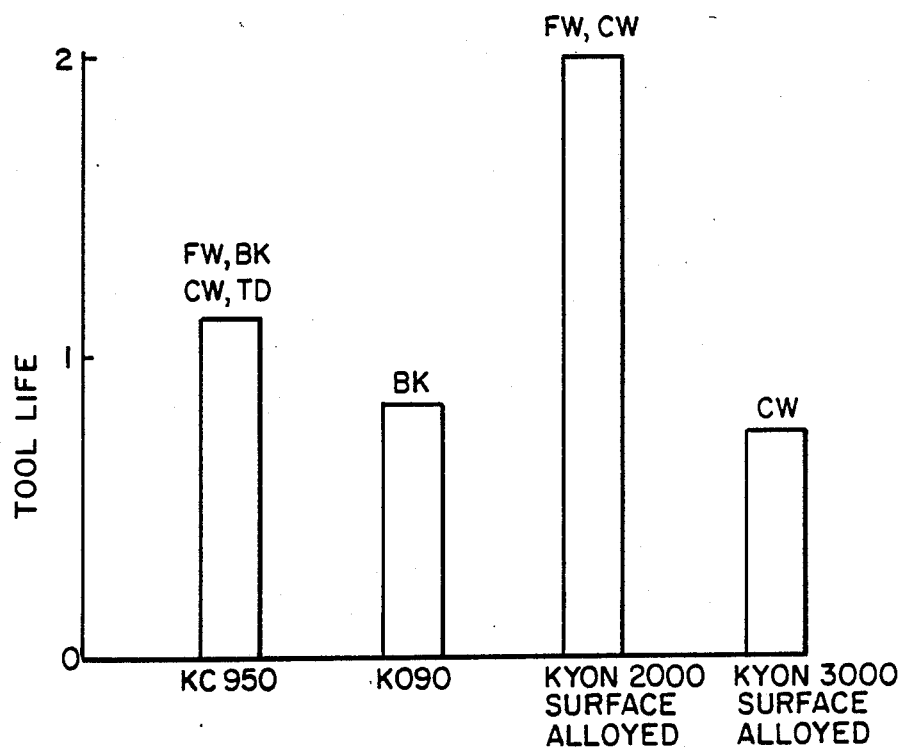

FIG. 4 is a bar graph comparing tool-lives (minutes) and failure modes of a cemented carbide (KC950), a two-phase ceramic composition comprising alumina and titanium carbide (K090) and two surface alloyed sialon compositions according to this invention; specifically, an alpha-prime-sialon/beta-prime-sialon composition (KYON 2000) and a beta-prime-sialon composition (KYON 3000) in high speed roughing of medium carbon steel (1045).

DETAILED DESCRIPTION OF THE INVENTION

Examples I and II

Specimens of a commercially available alpha-prime-sialon/beta-prime-sialon composition previously used for cutting tool applications (KYON 2000) and specimens of another commercially available beta-prime-sialon material also previously used for cutting tool applications (KYON 3000) were coated by chemical vapor deposition at 950 degrees Centigrade for a time long enough to build up an alumina coating between 5 and 7 microns thick. The specimens had previously been manufactured by known processes, for example, as set forth in U.S. Pat. Nos. 4,563,433 and 3,991,166. (The coatings for the examples being described were applied to previously sintered and densified specimens; however, applicants contemplate that the coatings could be applied to specimens that have been sintered but not yet fully densified by hot isostatic pressing. Where the specimens have to be densified by uniaxial hot pressing in graphite molds, the coating normally would follow the densification by hot pressing and shaping by grinding.) The coated specimens were then heat treated at 1750 degrees Centigrade in helium at 20 ksi. The heat treatment (in this case by hot isostatic pressing) resulted in significant interdiffusion between the alumina coating and the substrate or core specimen.

Properties of the specimens of Example I (KYON 2000) and Example II (KYON 3000) as received, with a 6 micron alumina coating and with surface alloying according to this invention are set forth in Tables 1 and 2, respectively.

TABLE 1

| PROPERTY | EXAMPLE I | | |
|---|---|---|---|
| | AS RE-CEIVED | COATED | HEAT TREATED |
| Density (g/cc): | 3.269 | 3.277 | 3.275 |
| Vickers Hardness - 18.5 kg (GPa): | 15.50 ± .22 | 15.67 ± .24 | 15.84 ± .20 |
| Fracture Toughness - 18.5 kg Palmqvist | | | |
| W (kg/mm): | 37.17 ± .99 | 35.11 ± 2.06 | 39.08 ± .39 |
| $K_{1C}$—(MPam$^{\frac{1}{2}}$)$^2$: | 6.51 ± .11 | 6.66 ± .25 | 6.72 ± .04 |
| X-ray Diffraction: of core | $\beta'$, $\alpha'$,* | $\beta'$, $\alpha'$,* | $\beta'$, $\alpha'$,* |

* = Very low N-Apatite or N-YAM
$^2K_{1C}$ was determined in accordance with Evans and Charles, "Fracture Toughness Determinations by Indentation," J.Am. Ceramic Society, Vol. 59, No. 7–8, P. 731.

TABLE 2

| PROPERTY | EXAMPLE II | | |
|---|---|---|---|
| | AS RE-CEIVED | COATED | HEAT TREATED |
| Density (g/cc): | 3.248 | 3.183 | 3.213 |
| Vickers Hardness - 18.5 kg (GPa): | 14.75 ± .18 | 14.23 ± .36 | 14.76 ± .13 |
| Fracture Toughness - 18.5 kg Palmqvist | | | |
| W (kg/mm): | 42.91 ± .54 | 32.81 ± 2.93 | 44.95 ± 2.63 |
| $K_{1C}$—(MPam$^{\frac{1}{2}}$): | 7.02 ± .04 | 5.96 ± .38 | 7.16 ± .17 |
| X-ray Diffraction: of core | $\beta'$, B | $\beta'$, B | $\beta'$ |

B = B-phase

Selected data from Tables 1 and 2 are set forth in FIGS. 1 and 2. With reference to FIG. 1, it can be seen that hardness of the substrate is only slightly affected by a chemical vapor deposition coating and is somewhat improved by surface alloying, i.e., coating followed by hot isostatic pressing. With reference to FIG. 2, it is quite clear that coating alone has a pronounced detrimental effect on fracture toughness, but that surface alloying measurably improves fracture toughness. Fracture toughness of KYON 3000 appears to be much more sensitive to the coating and hot isostatic pressing treatments compared to KYON 2000.

X-ray diffraction data on the surface alloyed samples showed no distinct alumina phase and no new phases as compared with the as-received sialon materials. The B-phase was not detected in the KYON 3000 after the hot isostatic pressing.

Metal Cutting Tests

High speed steel roughing is the intended application of coated sialon tool inserts. Metal cutting tests were conducted on Examples I and II under the following conditions representing high speed steel roughing applications:

| | |
|---|---|
| Workpieces: | 1045 Steel |
| | 4340 Steel |
| Speed: | 1000 surface feet per minute (sfm) |
| Feed: | 0.025 inches per revolution (ipr) |
| Depth of Cut: | 0.15 inch |
| Insert Style: | SNG - 433 |

1045 is a medium carbon steel and 4340 is a low alloy steel.

The results of the metal cutting tests for Examples I and II are shown in FIGS. 3 and 4. These are bar graphs wherein tool-life in minutes is reported along with the failure mode: NW=nose wear failure; FW=flank wear failure; CW=crater wear failure; BK=breakage failure and TD=thermal deformation failure. The surface alloyed sialon cutting tools were compared with a commercial cemented carbide tool (KC950) in a test with the low alloy steel. As shown in FIG. 3, both of the surface coated sialons have superior tool life, the sialon tools failing in the more predictable wear modes. The surface alloyed sialon cutting tools were compared to commercial cemented carbide tools (KC950) and commercial ceramic tools (K090) in a test with medium carbon steel. The surface alloyed alpha-prime-sialon/beta-prime-sialon (KYON 2000) had decidedly superior service life failing in the more predictable wear modes. The beta-prime-sialon (KYON 3000) had adequate tool life compared to the cemented carbide and ceramic tools but certainly not as long. Failure, however was in the more predictable wear mode.

Stated another way, the surface alloyed KYON 2000 tool had almost twice the tool life of the cemented carbide tool with both steels.

Examples III–VII

A number of variations of Example I were investigated. In Example I and all the variations discussed in this section, the time at temperature during the heat treatment was one hour. Example III was similar to Example I except that the heat treatment was at 1100 degrees Centigrade at 20 ksi argon atmosphere (hot isostatic pressure). Example IV was similar to Example I except the heat treatment was 1600 degrees Centigrade at 15 psi (atmospheric pressure) in an argon atmosphere. Example V was similar to Example I except that the heat treatment was at 1600 degrees Centigrade at 20 ksi nitrogen atmosphere (hot isostatic pressure). Example VI was similar to Example I except that the heat treatment was at 1750 degrees Centigrade at 20 ksi nitrogen atmosphere (hot isostatic pressure).

Example VII was similar to Example I except that heat treatment was at 600 degrees Centigrade at 15 psi nitrogen (atmospheric pressure). The variation in hardness, toughness and surface composition for Examples III or vII are set forth in the following Table 3.

TABLE 3

| EXAMPLE | VICKERS HARDNESS 18.5 kg (GPa) | PALMQVIST TOUGHNESS 18.5 kgW(kg/mm) | X-RAY DIFFRACTION OF SURFACE |
|---|---|---|---|
| KYON 2000 | 15.50 | 37.17 | beta prime, alpha prime |
| KYON 2000 (as coated) | 15.67 | 35.11 | alumina, beta prime, alpha prime |
| III | 13.72 | 24.12 | beta prime, alumina, B-, phase, alpha prime, N-YAM |
| IV | 16.11 | 35.22 | beta prime, alumina, alpha prime, N-melilite |
| V | 16.06 | 37.55 | beta prime, alumina, alpha prime |
| VI | 16.10 | 37.27 | beta prime, alpha prime |
| VII | 16.11 | 34.66 | beta prime, alumina, alpha prime, N-melilite |

Example III shows that insufficient heat treatment (1100 degrees Centigrade) resulted in reduced hardness and toughness. Comparing Examples V and VII shows that hot isostatic pressing can result in improved toughness over heat treatment at atmospheric pressure at the same treatment temperatures. Comparison of Examples V and VI shows that increase in heat treating temperature can result in complete diffusion of the aluminum and oxygen of the alumina into the sialon surface leaving only the beta-prime-sialon and alpha-prime-sialon phases.

Examples VIII–IX

Examples VIII and IX were similar to Example I except that following the chemical vapor deposition of the alumina coating, an outer titanium nitride coating was applied also by chemical vapor deposition over the alumina coating. The heat treatment given Example VIII was one hour at 1750 degrees Centigrade in a 20 ksi nitrogen atmosphere. The heat treatment for Example IX was one hour at 1750 degrees Centigrade in a 20 ksi argon atmosphere. The titanium nitride coating was intact after the heat treatments and did not react with the sialon core.

Examples X–XI

Examples X and XI were similar to Example I except the heat treating comprised one hour at 1650 degrees Centigrade in 15 psi nitrogen and one hour at 1650 degrees Centigrade in 20 ksi nitrogen.

Metal Cutting Tests

Metal cutting tests were conducted on Examples VIII to XI under the following conditions:

| Workpieces: | 1045 steel |
|---|---|
| Speed: | 1000 sfm |
| Feed: | .025 ipr |
| Depth of Cut: | 0.1 inch |
| Insert Style: | SNG-453 |

The results of the metal cutting tests are set forth in the following Table 4:

TABLE 4

| EXAMPLE | TOOL LIFE (MINUTES) | FAILURE MODE |
|---|---|---|
| VIII | 2.5 | NW, DOCN |
| IX | 2.4 | FW, DOCN |
| X | 4.4 | FW, CH |
| XI | 2.6 | FW, CR |
| I | 2.0 | FW, CR |
| KYON 2000 | <0.7 | FW, CR |
| KYON 2000 (as coated) | 1.0 | FW, CR |

The acronyms for the failure modes noted in Table 4 mean the following: FW=flank wear failure; CR=crater wear failure; CH=chipped; DOCN=depth of cut notch failure; and NW=nose wear failure.

The data in Table 4 establishes the substantial advantage of surface alloyed compositions according to this invention when used as cutting tool inserts. Examples VIII to XI all had tool life at least twice that of KYON 2000 and coated (but not surface alloyed) KYON 2000.

The applicants do not wish to be bound by any proposed theory but it now appears that the surface alloying according to this invention has the effect of increasing the Z value in the beta-prime-sialon phase near the surface. Recall the beta-prime-sialon has the general formula $Si_{6-z}AL_zO_zN_{8-z}$.

Having thus described the invention with the detail and particularity required by the Patent Laws, what is desired protected by Letters Patent is set forth in the following claims.

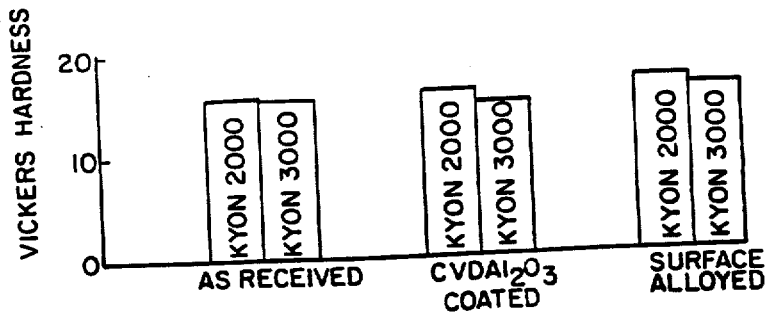

What is claimed is:

1. A method of alloying the surface of a sialon article consisting essentially of beta-prime-sialon phase to increase the Z value of the beta-prime-sialon phase near the surface, said method comprising the steps of:
   (a) preparing a sialon article,
   (b) applying an approximately 1 to 10 micron thick coating of alumina to the surface of the sialon article by chemical vapor deposition, and
   (c) heat treating the coated sialon article at a temperature between about 1300 to 1800 degrees Centigrade to diffuse oxygen and aluminum of the alumina coating into the surface of the sialon article to produce a diffusion zone containing beta-prime-sialon with an increased Z value compared to beta-prime-sialon phase in the remainder of the sialon article.

2. The method according to claim 1 wherein the sialon article further consists essentially of alpha-prime-sialon and an intergranular phase.

3. The method according to claim 1 wherein the sialon article further consists essentially of 0.1 to 10 volume percent intergranular phase.

4. The method according to claim 2 wherein the volume ratio of alpha-prime-sialon to beta-prime-sialon is between 5:95 and 95:5.

5. The method according to claim 2 wherein the sialon article further consists essentially of a refractory phase selected from the group consisting of refractory oxides, carbides, and nitrides of metals, and mixtures, compounds and solid solutions thereof.

6. The method according to claim 1 wherein the chemical vapor deposition of the alumina coating is made at temperatures between 800 and 1100 degrees Centigrade.

7. The method according to claim 1 wherein the chemical vapor deposition of the alumina coating is made at temperatures between 950 and 1050 degrees Centigrade.

8. The method according to claim 1 wherein the thickness of the alumina coating applied by chemical vapor deposition is between 5 and 7 microns.

9. The method according to claim 1 wherein the heat treating takes place at temperature between 1500 and 1700 degrees Centigrade, and for a period between 15 minutes and 5 hours in a non-oxidizing atmosphere.

10. The method according to claim 1 wherein the heat treating takes place for a period between 15 minutes and 5 hours in a non-oxidizing atmosphere.

11. The method according to claim 1 wherein the heat treating takes place under isostatic pressing conditions in an atmosphere selected from the gases nitrogen, helium, and argon and mixtures thereof.

12. The method according to claim 1 wherein the heat treating is discontinued prior to the time all of the aluminum and oxygen of the alumina coating has diffused into the surface of the sialon article.

13. The method according to claim 1 further comprising the step of depositing an outer refractory coating by chemical vapor deposition over the alumina coating, said outer refractory coating selected from the group carbides, nitrides, carbo-nitrides, oxides and mixtures thereof of vanadium, titanium, tantalum, niobium, hafnium or zirconium.

14. The method according to claim 1 wherein said heat treating is performed at a temperature and for a time sufficient to provide said diffusion zone with a thickness of 2 to 10 microns.

15. The method according to claim 2 wherein said heat treating is performed at a temperature and for a time sufficient to provide said diffusion zone with a thickness of 2 to 10 microns.

16. The method according to claim 1 wherein the sialon article further consists essentially of a refractory phase.

17. The method according to claim 2 wherein the sialon article further consists essentially of a refractory phase.

18. A method according to claim 2 wherein the heat treating is discontinued prior to the time all of the aluminum and oxygen of the alumina coating has diffused into the surface of the sialon article.

19. A method according to claim 14 wherein the heat treating is discontinued prior to the time all of the aluminum and oxygen of the alumina coating has diffused into the surface of the sialon article.

20. A method according to claim 15 wherein the heat treating is discontinued prior to the time all of the aluminum and oxygen of the alumina coating has diffused into the surface of the sialon article.

21. The method according to claim 1 wherein said beta-prime-sialon phase in said diffusion zone has a Z value less than or equal to 4.

22. The method according to claim 3 wherein said beta-prime-sialon phase in said diffusion zone has a Z value less than or equal to 4.

23. The method according to claim 14 wherein said beta-prime-sialon phase in said diffusion zone has a Z value less than or equal to 4.

24. The method according to claim 15 wherein said beta-prime-sialon phase in said diffusion zone has a Z value less than or equal to 4.

* * * * *

UNITED STATES PATENT AND TRADEMARK OFFICE
CERTIFICATE OF CORRECTION

PATENT NO. : 4,913,936                           Page 1 of 2

DATED      : April 3, 1990

INVENTOR(S) : Pankaj K. Mehrotra and Joyce L. Swiokla

It is certified that error appears in the above-identified patent and that said Letters Patent is hereby corrected as shown below:

Title Page, remove entirely the drawing figure illustrated.

Column 5, Table 1, line 45,
"6.51 ± .11   6.66 ± .25   6.72 ± .04" should read
--6.51 ± .11   6.26 ± .25   6.72 ± .04--
Column 5, Table 2, line 58,
"14'75 ± .18   14.23 ± .36   14.76 ± .13" should read
--14.75 ± .18   14.23 ± .36   14.76 ± .13--

Column 7, line 9, "600" should read --1600--
Column 7, line 12, "III or vII" should read --III to VII--

Column 8, line 41, the formula "$Si_{6-z} AL_z O_z N_{8-z}$" should read
--$Si_{6-z} Al_z O_z N_{8-z}$--

Column 9, line 22 (Claim 9, line 2) "temperature" should read --temperatures--

Column 10, line 1 (Claim 13, line 6) "of vanadium" should read --of the vanadium--

Column 10, line 32 (Claim 22, line 1) "claim 3" should read --claim 2--.

Signed and Sealed this

Twenty-ninth Day of June, 1993

Attest:

MICHAEL K. KIRK

*Attesting Officer*    *Acting Commissioner of Patents and Trademarks*

United States Patent [19]

Mehrotra et al.

[11] Patent Number: 4,913,936
[45] Date of Patent: Apr. 3, 1990

[54] METHOD OF SURFACE ALLOYING SIALON ARTICLES

[75] Inventors: Pankaj K. Mehrotra, Greensburg; Joyce L. Swiokla, Ligonier, both of Pa.

[73] Assignee: Kennametal Inc., Latrobe, Pa.

[21] Appl. No.: 331,474

[22] Filed: Mar. 30, 1989

Related U.S. Application Data

[62] Division of Ser. No. 51,964, May 19, 1987, abandoned.

[51] Int. Cl.⁴ .................. C23C 16/32; C23C 16/40
[52] U.S. Cl. .................. 427/249; 427/255; 427/255.2; 427/255.3; 427/255.7; 427/376.2; 427/419.2; 427/419.7
[58] Field of Search .................. 427/255, 249, 255.1, 427/255.3, 255.7, 376.2, 419.2, 419.7, 248.1

[56] References Cited

U.S. PATENT DOCUMENTS

| | | | |
|---|---|---|---|
| 3,914,473 | 10/1975 | Hale | 427/255 |
| 4,127,416 | 11/1978 | Lumby et al. | 501/97 |
| 4,336,304 | 6/1982 | Landingham et al. | 428/336 |
| 4,424,066 | 1/1984 | Sarin et al. | 51/295 |
| 4,469,489 | 9/1984 | Sarin et al. | 51/295 |
| 4,539,251 | 9/1985 | Sugisawa et al. | 428/216 |
| 4,547,470 | 10/1985 | Tanase et al. | 501/87 |
| 4,563,433 | 1/1986 | Yeckley et al. | 501/97 |
| 4,578,087 | 3/1986 | Tanaka et al. | 51/295 |
| 4,613,549 | 9/1986 | Tanaka et al. | 428/469 |
| 4,629,661 | 12/1986 | Hillert | 428/698 |

FOREIGN PATENT DOCUMENTS

| | | | |
|---|---|---|---|
| 3509572 | 7/1986 | Fed. Rep. of Germany | 427/255 |
| 55-85481 | 6/1980 | Japan | 427/255 |
| 58-145676 | 8/1983 | Japan | 427/255 |

*Primary Examiner*—Sadie Childs
*Attorney, Agent, or Firm*—John J. Prizzi

[57] ABSTRACT

A method of surface alloying a sialon article containing beta-prime-sialon phase ($Si_{6-z}Al_zO_zN_{8-z}$). The method includes the steps of applying an alumina coating to the surface of the sialon article by chemical vapor deposition and then heat treating the coated article at a temperature between about 1300 and 1800 degrees Centigrade for a time sufficient to diffuse some or all of the aluminum and oxygen from the alumina coating into the sialon composition to produce a layer containing beta-prime-sialon phase having an increased Z value compared to the beta-prime-sialon phase in the remainder of the article.

24 Claims, 2 Drawing Sheets